(12) United States Patent
Choi et al.

(10) Patent No.: US 6,451,663 B1
(45) Date of Patent: Sep. 17, 2002

(54) METHOD OF MANUFACTURING A CYLINDRICAL STORAGE NODE IN A SEMICONDUCTOR DEVICE

(75) Inventors: Sung-Gil Choi; Tae Hyuk Ahn, both of Youngin; Sang Sup Jeong, Suwon; Dae Hyuk Chung, Sungnam; Won Jun Lee, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/983,348

(22) Filed: Oct. 24, 2001

(30) Foreign Application Priority Data

Oct. 27, 2000 (KR) .......................................... 2000-63415

(51) Int. Cl.⁷ .............................................. H01L 21/20
(52) U.S. Cl. ...................... 438/386; 438/396; 438/397; 438/744; 438/949
(58) Field of Search .................. 438/397, 396, 438/386, 253, 744, 949, 254, 718, 724, 735; 257/306, 309, 296

(56) References Cited

U.S. PATENT DOCUMENTS

| | | | | |
|---|---|---|---|---|
| 5,150,276 A | * | 9/1992 | Gonzalez et al. | 257/296 |
| 5,164,881 A | * | 11/1992 | Ahn | 257/309 |
| 5,389,568 A | * | 2/1995 | Yun | 438/396 |
| 5,573,968 A | * | 11/1996 | Park | 438/398 |
| 5,620,918 A | * | 4/1997 | Kondoh | 438/396 |
| 5,702,974 A | * | 12/1997 | Kim | 438/397 |
| 6,031,262 A | * | 2/2000 | Sakao | 257/296 |
| 6,323,100 B1 | * | 11/2001 | Kimura | 438/253 |

FOREIGN PATENT DOCUMENTS

| | | | |
|---|---|---|---|
| JP | 10-50951 | * | 2/1998 |
| JP | 10-289981 | * | 10/1998 |
| JP | 11-238852 | * | 8/1999 |

* cited by examiner

Primary Examiner—Michael S. Lebentritt
(74) Attorney, Agent, or Firm—Lee & Sterba, P.C.

(57) ABSTRACT

A method of manufacturing a cylindrical storage node in a semiconductor device, in which loss differences of the cylindrical storage node between the center and the edge of cell areas, caused by an etch-back process of storage node isolation, is minimized, thereby maintaining uniform electrical capacitances over the entire area of a semiconductor wafer.

11 Claims, 5 Drawing Sheets

METHOD OF MANUFACTURING A CYLINDRICAL STORAGE NODE IN A SEMICONDUCTOR DEVICE

BACKGROUND OF THE INVENTION

1. Field of the Invention

The present invention refers to a method of manufacturing a cylindrical storage node in a semiconductor device with a minimum loss difference of a conductive layer between the center and the edge of cell areas during an etch-back process of storage node isolation. The method of manufacturing a cylindrical storage node according to the present invention maintains electric capacitance uniformity over the entire cell area of a wafer and results in improved device reliability.

2. Description of the Related Art

A semiconductor memory device like a dynamic random access memory (DRAM) includes cell capacitors for storing data. As the degree of integration in a semiconductor memory device increases, the area of a cell unit decreases. Therefore, several approaches to guarantee availability of required capacitances in a limited space of a semiconductor memory device are researched and developed.

In general, cylindrical stack structures are known as universal capacitor structures. Referring to FIG. 1, in order to produce a cylindrical storage node in a semiconductor device, a poly plug 12 for bit line BC contacts is produced in an interlayer insulator 10, and a nitride layer is deposited as an etch stopping layer 14. As a next process step to produce the cylindrical storage node, a molding oxide layer 16 is deposited on the nitride layer 14, and a hole 18 is produced in the molding oxide layer 16 using a photolithographic etch process. The nitride layer 14, exposed in the bottom of the hole 18, is removed in an etch-back process and the poly plug 12 is exposed. Finally, a storage conductive layer 20 is deposited to a uniform thickness.

Referring to FIG. 2, a plugging material 22 is deposited to fill-up the inside of the hole 18 on the storage conductive layer 20. The plugging material 22 protects the bottom of the hole 18 in the storage node from being etched completely in the etch-back process of isolating the storage node. The height of the deposited plugging material 22 in the center area of the cell having the holes 18 is lower than the height of the deposited plugging material 22 in the cell surrounding areas without the holes 18 in an amount of 2500 to 3000 Å.

In general, the time required to complete any etch-back process can be calculated by determining the average etch rate of the process and calculating the time necessary to etch through the layer. Etching is then allowed to continue for an over-etch period necessary to compensate any etch rate non-uniformity, layer thickness non-uniformity, or underlying topography. It is generally desirable to minimize the over-etch time so that the erosion of the underlying layer is minimized. A method of determining the nominal etching endpoint of the process allows such a reduction in over-etch time.

The endpoint of the etch-back process as illustrated in FIG. 3 is an etching time required for completely removing the storage conductive layer in cell surrounding areas. The etch-back process removes the plugging material 22 and the storage conductive layer 20 up to the location indicated by a broken line 30 in FIG. 3. Isolation for the storage node is then achieved among each of the holes 18. The center area of the cell is then etched more than the cell surrounding areas by an amount of about 3000 Å so that the height of the cylindrical node becomes lower than before, which renders maintaining sufficient capacitances in the semiconductor memory device difficult.

Referring to FIG. 4, the etch-back process removes the plugging material 22 and the molding oxide layer 16 by employing an etch selectivity ratio between the oxide layer and the polysilicon and produces a cylindrical storage node 26.

One storage node isolation method is a lift-off method that removes the plugged oxide layer remaining inside of the hole 18 by employing an etchant solution consisting of hydrogen fluoride (HF). The HF etchant etches not only the plugged oxide layer but it also etches the interlayer insulator 10 underlying the etch stopping layer 14, in the edge areas of a wafer. As a result, defects such as bridge defects are generated as the next process steps are performed on the wafer. Such defects may lead to failure in driving the semiconductor device, such as twin-bit failure in electrical die sorting EDS tests, which decreases the reliability of the final semiconductor devices.

Another method of storage node isolation employs a flowable oxide as the plugging material inside of the hole 18 and isolates the storage node by a chemical-mechanical polishing (CMP) process. However, the CMP process changes the surface morphology of a wafer and produces non-uniform heights of the storage nodes between cells or chips because of micro scratches, which also result in lowering device reliability.

SUMMARY OF THE INVENTION

To overcome the above described problems, the present invention provides a method of manufacturing a cylindrical storage node of a semiconductor device that minimizes a loss difference of the conductive layer, between the center and the edge areas of a cell, caused by an etch-back process of storage node isolation. The method of manufacturing a cylindrical storage node of a semiconductor device according to the present invention maintains uniform electrical capacitances over the entire cell areas of a wafer, which results in improved reliability of the semiconductor device.

In accordance with a preferred embodiment of the present invention, there is provided a method of manufacturing a cylindrical storage node in a semiconductor device, comprising forming a plurality of holes in a molding insulator on cell areas, etching an etch stopping layer at the bottom of each hole and exposing a poly plug, depositing a conductive layer of a uniform thickness on the molding insulator having the plurality of holes, filling a plugging material on the conductive layer deposited on the plurality of holes, removing an upper portion of the plugging material by an etchback process to expose an upper portion of the molding insulator and the conductive layer in surrounding areas of each hole, removing the conductive layer exposed in surrounding areas of each hole to isolate the conductive layer in each hole from the conductive layer in other holes, removing the plugging material from each hole, and removing the remaining molding insulator.

In another embodiment of the present invention, there is provided another method of manufacturing a cylindrical storage node in a semiconductor device, comprising forming a plurality of holes in a molding insulator on cell areas, etching an etch stopping layer at the bottom of each hole and exposing a poly plug, depositing a conductive layer of a uniform thickness on the molding insulator having the plurality of holes, filling a plugging material, which is an oxide layer, on the conductive layer deposited on the plurality of holes, removing an upper portion of the plugging material by a wet etch process to expose an upper portion of the molding insulator and the conductive layer in surrounding areas of each hole, removing the conductive layer exposed in surrounding areas of each hole to isolate the conductive layer in each hole from the conductive layer in other holes, removing the plugging material from each hole, and removing the remaining molding insulator.

According to a feature of the present invention, the plugging material is a photoresist which can be etched during the etch-back process by a mixed gas of oxygen and nitrogen as a reactive gas. According to another feature of the present invention, the plugging material is an oxide layer, which is one of undoped silicate glass (USG), a boron-phosphorus-silicate glass (BPSG), a silicate on glass (SOG), and a flowable oxide. According to another feature of the present invention, the oxide layer can be etched during the etch-back process by reactive gas mixtures such as $CHF_3/CO/Ar$ or $C_5F_8/O_2/Ar$ to utilize C—C, CFx radicals that etch the oxide layer selectively, or by a wet etch process involving a solution containing HF.

According to a feature of the present invention, the etchant used for removing the exposed conductive layer is a main gas $SF_6$ and an additional gas $Cl_2$ or $O_2$ that performs an isotropic etch to the exposed conductive layer. According to another feature of an embodiment of the present invention, the plugging material remaining inside of the multiple holes is removed by an ashing process or a wet etch process.

These and other features of the present invention will be readily apparent to those of ordinary skill in the art upon review of the detailed description that follows.

BRIEF DESCRIPTION OF THE DRAWINGS

For a more complete understanding of the present invention and the advantages hereof, reference is now made to the following description taken in conjunction with the accompanying drawings, in which like reference numerals denote like parts, and in which.

DETAILED DESCRIPTION OF PREFFERED EMBODIMENTS

Figure 1:
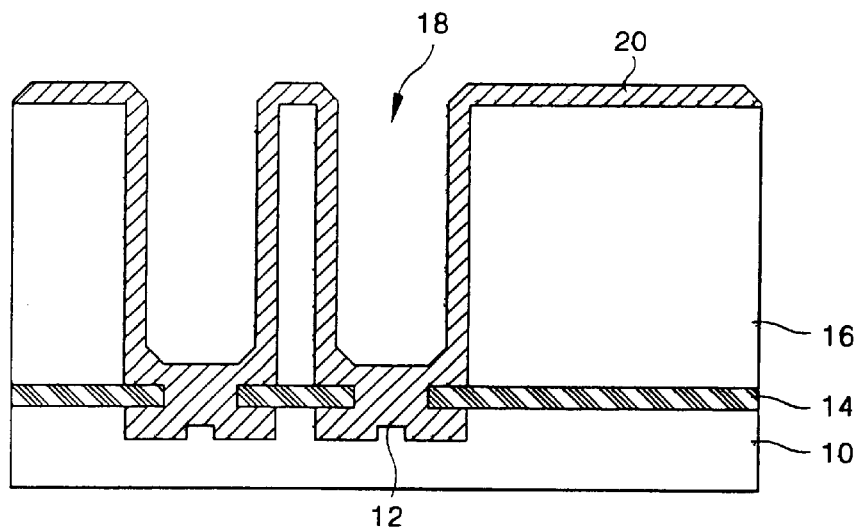
FIGS. 1–4 are cross-sectional drawings of a semiconductor device sequentially illustrating a conventional method of manufacturing a cylindrical storage node.
Figure 2:
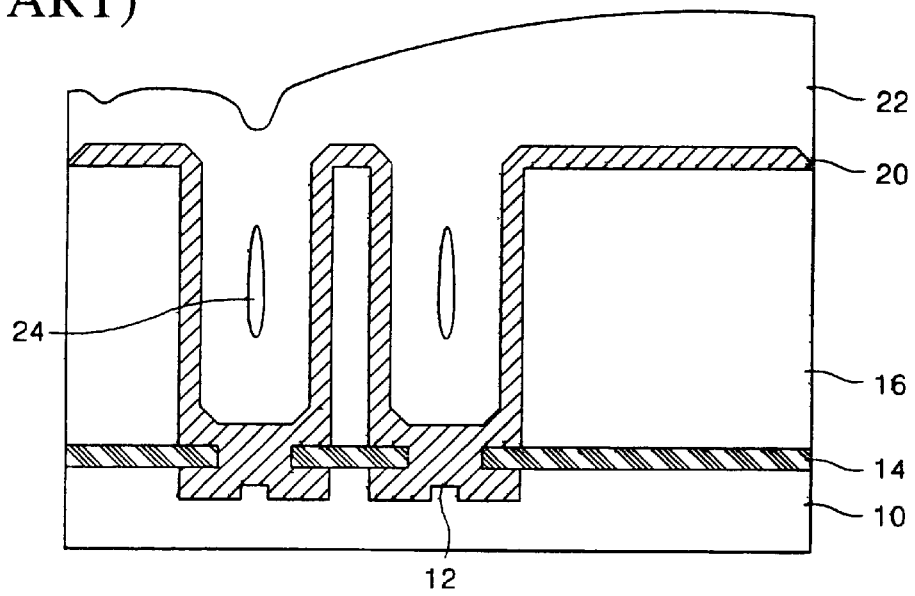
Figure 3:
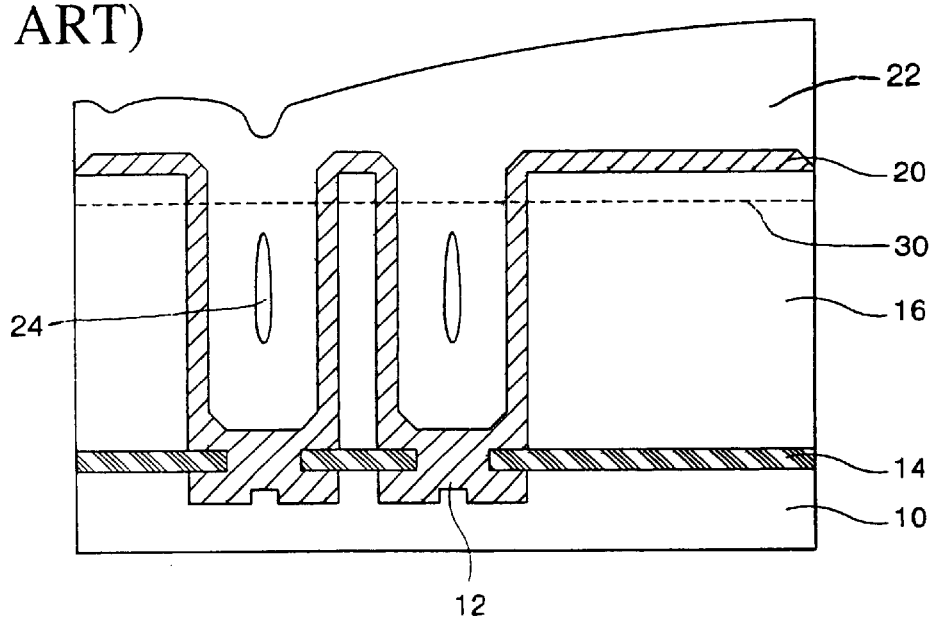
Figure 4:
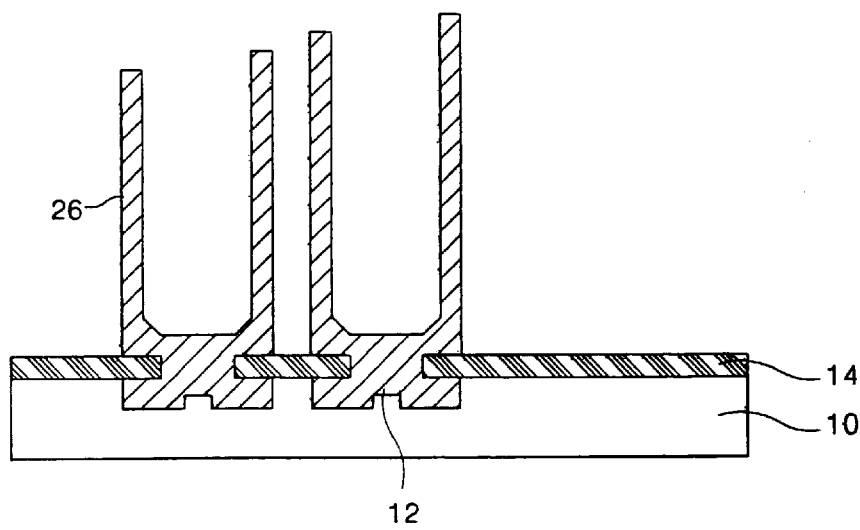

Korean Patent Application No. 2000-63415, filed on Oct. 27, 2000, and entitled: "Cylindrical Storage Node Manufacturing Method in Semiconductor Device", is incorporated herein by reference in its entirety.

The present invention now will be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those of ordinary skilled in the art. In the drawings, the thickness of layers and regions are exaggerated for clarity. It will also be understood that when a layer is referred to as being "on" another layer or substrate, it can be directly on the other layer or substrate, and one or more intervening layers may also be present. Further, it will be understood that when a layer is referred to as being "under" another layer, it can be directly under, and one or more intervening layers may also be present.

Reference will now be made in detail to preferred embodiments of the present invention, an example of which is illustrated in the accompanying drawings.

FIGS. 5–9 are cross-sectional drawings of a semiconductor device sequentially illustrating a method of manufacturing a cylindrical storage node in a semiconductor device according to the present invention.

Figure 5:
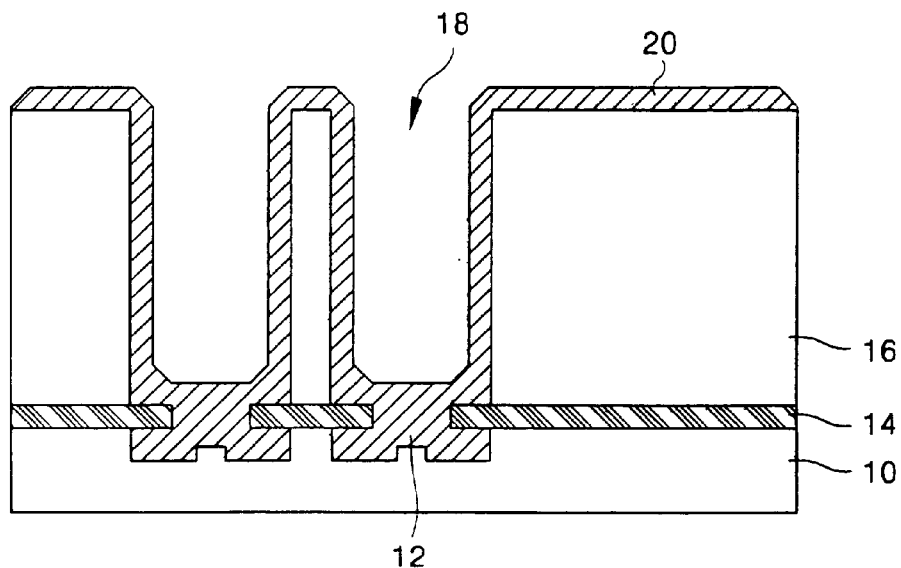
FIGS. 5–9 are cross-sectional drawings of a semiconductor device sequentially illustrating a method of manufacturing a cylindrical storage node in a semiconductor device according to the present invention.

Referring now to FIG. 5, on a semiconductor substrate having an active area, a gate, and a bit line (not shown), an interlayer insulator 10 is deposited, a poly plug 12 for a bit line contact BC is formed on the interlayer insulator 10, and a nitride layer is deposited as an etch stopping layer 14.

A molding oxide layer 16 is then deposited on the nitride layer 14, and the hole 18 is produced in the molding oxide layer 16 using a photolithography and an etching process. The etchback process removes the nitride layer exposed at the bottom of the hole 18 and then the poly plug 12 is exposed. After these processes, a storage conductive layer 20 is deposited to a uniform thickness.

Figure 6:
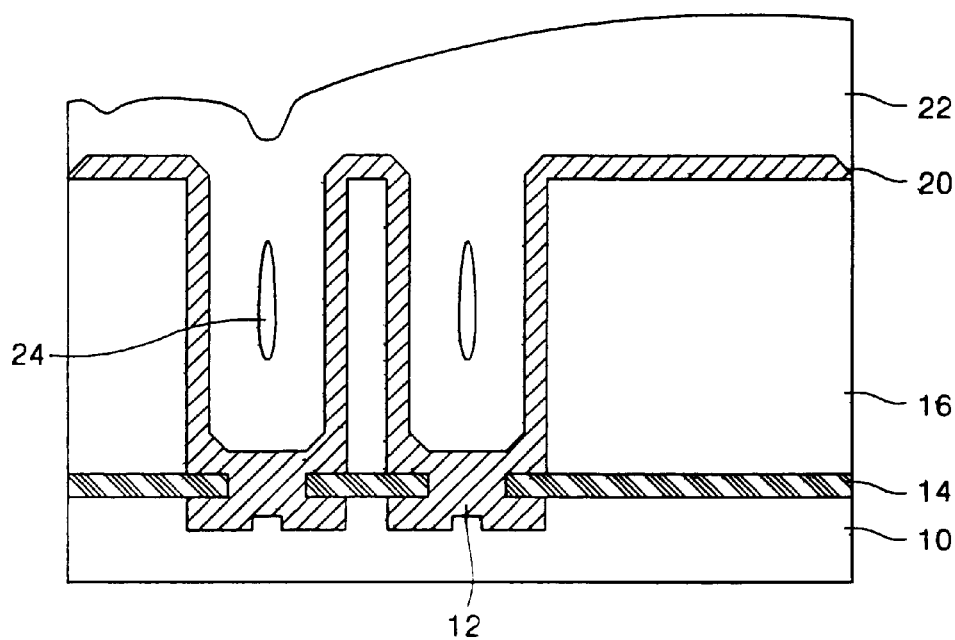

Referring to FIG. 6, in order to fill the inside of the hole 18 on the storage conductive layer 20, a plugging material 22 such as a photoresist, chemical vapor deposition CVD oxide layer, or a flowable oxide layer, is deposited.

The CVD oxide layer includes a high temperature undoped silicate glass (USG), boron-phosphorous-silicate glass (BPSG), silicate on glass (SOG). The plugging material 22 prevents the bottom of the hole in the storage node from being etched during an etchback process intended for isolating the storage node. The deposited plugging material 22 in the cell surrounding areas, without the hole 18 underneath, is higher than that in the center of cell areas within the hole 18 by between about 2,500 to 3,000 Å.

Figure 7:
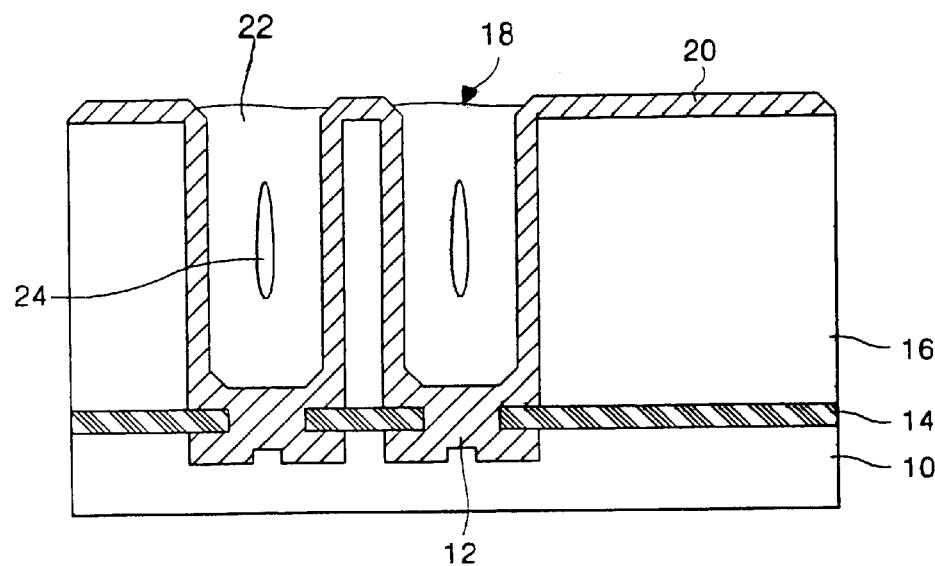

Referring to FIG. 7, the etchback process employs a reactive gas mixture of oxygen and nitrogen so that an etch rate in the cell surrounding areas is faster than that in the center of the cell areas in the case that the plugging material 22 is a photoresist. The etchback process etches the photoresist until the etchback process time reaches an endpoint where the photoresist in the cell surrounding areas is removed completely and the plugging photoresist material 22 remain only inside of the hole 18.

When the plugging material 22 employs an oxide layer, the etchback process employs a reactive gas with a high etching selectivity ratio, for example $CHF_3/CO/Ar$ or $C_5F_8/O_2Ar$, between a polysilicon and the oxide layer. Therefore, the etchback process removes the plugging material 22 by using C—C or CFx radical and only the plugging material 22 inside of the hole 18 remains.

On the contrary, when the process employs an oxide layer as the plugging material 22, a wet etch method employing an etching solution containing HF, for example the commercial product LAL200 (manufactured by Stellar, Japan), is used for removing the upper portion of the plugging oxide layer 22 except the oxide layer inside of the hole 18. The wet etching process exposes the upper portion of the molding insulator 16 and the conductive layer 20 in the surrounding areas of the multiple holes. Then, overetch amounts are determined within 50%, and more preferable overetch amounts are determined within 10%, because the excess overetch amounts in a wet etch process can expose the polysilicon at the bottom of the hole 18 in the case that the plugging material 22 has voids 24 as illustrated in FIG. 7.

Such an excess overetch process often causes etching of the polysilicon 12 exposed at the bottom of the hole 18, during the polysilicon etchback process of the surrounding areas, generating a bad chip.

Figure 8:
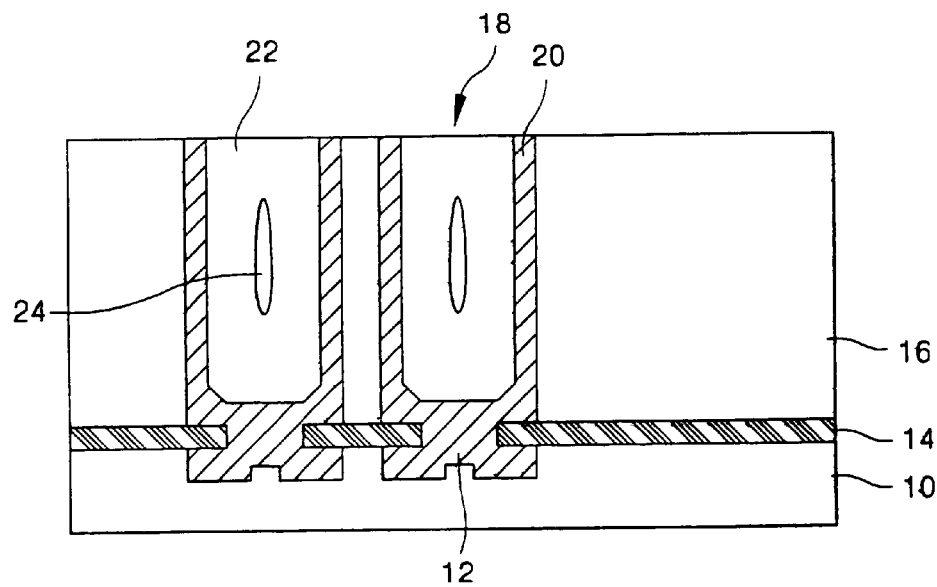

Referring to FIG. 8, the polysilicon etchback process performs an isotropic etch to the exposed polysilicon 12 except to the polysilicon inside of the hole 18, by employing a main gas $SF_6$ with an additional gas $Cl_2$ or $O_2$, and isolates the storage conductive layer 20 of one hole from that of the other holes.

Figure 9:
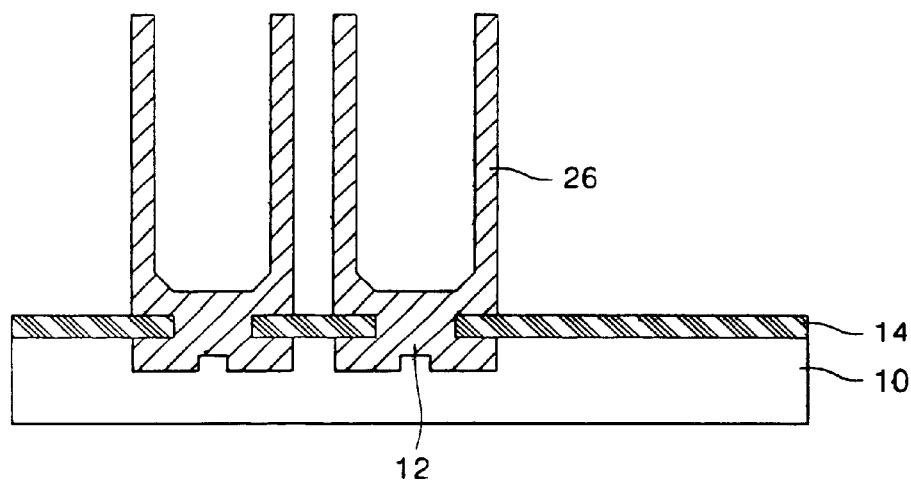

Referring to FIG. 9, the plugging material 22 remaining inside of the hole 18 is removed in an ashing process or a wet etch process, and finally, the molding oxide layer 16 is removed, and a cylindrical storage conductive node 26 is thereby obtained.

The height loss of the storage conductive node according to the present invention is within about 1,000 Å, so that the memory device according to the present invention can preserve more sufficient cell capacitances than the conventional memory device.

The present invention minimizes loss differences of the cylindrical storage node 26 between the center and the edge regions of cell areas caused by an etch-back process of storage node isolation in manufacturing a semiconductor device. Then, the cylindrical storage node manufacturing method according to the present invention maintains an uniform electric capacitance over the entire cell areas of a wafer, which results in an improved device reliability.

While the invention has been particularly shown and described with reference to preferred embodiments thereof, it will be understood by those skilled in the art that the foregoing and other changes in form and details may be made therein without departing from the spirit and scope of the invention as set forth in the following claims.

What is claimed is:

1. A method of manufacturing a cylindrical storage node in a semiconductor device, comprising:

forming a plurality of holes in a molding insulator on cell areas;

etching an etch stopping layer at the bottom of each hole and exposing a poly plug;

depositing a conductive layer of a uniform thickness on the molding insulator having the plurality of holes;

filling a plugging material on the conductive layer deposited on the plurality of holes;

removing an upper portion of the plugging material by an etchback process to expose an upper portion of the molding insulator and the conductive layer in surrounding areas of each hole;

removing the conductive layer exposed in surrounding areas of each hole to isolate the conductive layer in each hole from the conductive layer in is other holes;

removing the plugging material from each hole; and removing the remaining molding insulator.

2. A method of manufacturing a cylindrical storage node in a semiconductor device as claimed in claim 1, wherein the plugging material is a photoresist.

3. A method of manufacturing a cylindrical storage node in a semiconductor device as claimed in claim 2, wherein an etchant in the etchback process for removing the photoresist is a reactive gas mixture of oxygen and nitrogen.

4. A method of manufacturing a cylindrical storage node in a semiconductor device as claimed in claim 1, wherein the plugging material is an oxide layer.

5. A method of manufacturing a cylindrical storage node in a semiconductor device as claimed in claim 1, wherein an etchant in the etchback process for removing the oxide layer is selected from the group consisting of $CHF_3/CO/Ar$ and $C_5F_8/O_2/Ar$.

6. A method of manufacturing a cylindrical storage node in a semiconductor device as claimed in claim 1, wherein an etchant used in the etching process for removing the exposed conductive layer is a main gas $SF_6$ and an additional gas $Cl_2$ or $O_2$, and performs an isotropic etch to the exposed conductive layer.

7. A method of manufacturing a cylindrical storage node in a semiconductor device as claimed in claim 1, wherein the remaining plugging material inside of each hole is removed by an ashing process or a wet etch process.

8. A method of manufacturing a cylindrical storage node in a semiconductor device, comprising:

forming a plurality of holes in a molding insulator on cell areas;

etching an etch stopping layer at the bottom of each hole and exposing a poly plug;

depositing a conductive layer of a uniform thickness on the molding insulator having the plurality of holes;

filling a plugging material, which is an oxide layer, on the conductive layer deposited on the plurality of holes;

removing an upper portion of the plugging material by a wet etch process to expose an upper portion of the molding insulator and the conductive layer in surrounding areas of each hole;

removing the conductive layer exposed in surrounding areas of each hole to isolate the conductive layer in each hole from the conductive layer in other holes;

removing the plugging material from each hole; and removing the remaining molding insulator.

9. A method of manufacturing a cylindrical storage node in a semiconductor device as claimed in claim 8, wherein the oxide layer is one of undoped silicate glass (USG), a boron-phosphorous-silicate glass (BPSG), a silicate on glass (SOG), and a flowable oxide.

10. A method of manufacturing a cylindrical storage node in a semiconductor device as claimed in claim 8, wherein an etchant in the wet etch process for removing the oxide layer is a solution containing HF.

11. A method of manufacturing a cylindrical storage node in a semiconductor device as claimed in claim 10, wherein an overetch amount in the wet etch process for the oxide layer is within about 50%.

\* \* \* \* \*